US009775245B2

(12) United States Patent
Akagawa et al.

(10) Patent No.: US 9,775,245 B2
(45) Date of Patent: Sep. 26, 2017

(54) PAD-ARRAY STRUCTURE ON SUBSTRATE FOR MOUNTING IC CHIP ON SUBSTRATE, AND OPTICAL MODULE HAVING SAID PAD-ARRAY STRUCTURE

(71) Applicant: Photonics Electronics Technology Research Association, Tokyo (JP)

(72) Inventors: Takeshi Akagawa, Tokyo (JP); Kenichiro Yashiki, Tokyo (JP)

(73) Assignee: PHOTONICS ELECTRONICS TECHNOLOGY RESEARCH ASSOCIATION, Tokyo (JP)

( * ) Notice: Subject to any disclaimer, the term of this patent is extended or adjusted under 35 U.S.C. 154(b) by 0 days.

(21) Appl. No.: 15/128,904

(22) PCT Filed: Mar. 18, 2015

(86) PCT No.: PCT/JP2015/058012
§ 371 (c)(1),
(2) Date: Sep. 23, 2016

(87) PCT Pub. No.: WO2015/146738
PCT Pub. Date: Oct. 1, 2015

(65) Prior Publication Data
US 2017/0105284 A1    Apr. 13, 2017

(30) Foreign Application Priority Data

Mar. 24, 2014  (JP) ................. 2014-059690

(51) Int. Cl.
*G02B 6/12* (2006.01)
*H05K 1/11* (2006.01)
(Continued)

(52) U.S. Cl.
CPC .............. *H05K 1/111* (2013.01); *G02B 6/122* (2013.01); *G02B 6/4232* (2013.01);
(Continued)

(58) Field of Classification Search
CPC .................................................... G02B 6/4232
See application file for complete search history.

(56) References Cited

U.S. PATENT DOCUMENTS 6,384,341 B1    5/2002  Rothermel et al.
6,908,340 B1 *  6/2005  Shafer ................ H01R 13/6585
                                                      439/607.1
(Continued)

FOREIGN PATENT DOCUMENTS

EP    1310995 A2    5/2003
JP    S63-090865 U  6/1988
(Continued)

OTHER PUBLICATIONS

Yutaka Urino et al., "Demonstration of 12.5-Gbps optical interconnects integrated with lasers, optical splitters, optical modulators and photodetectors on a single silicon substrate", Optics Express, Dec. 10, 2012, pp. B256-B263 (13 sheets), vol. 20, No. 26, OSA—The Optical Society, Washington D.C., USA.
(Continued)

*Primary Examiner* — Rhonda Peace
(74) *Attorney, Agent, or Firm* — Michael Best & Friedrich LLP

(57) ABSTRACT

A pad-array arrangement structure on a substrate for mounting an IC chip on the substrate, wherein a structure with which it is possible to maximally avoid an increase in the number of wiring layers on the substrate is obtained by devising the pad arrangement in an IC pad-array region.
A embodiment of the present invention provides a pad-array structure on a substrate for mounting an IC chip on the substrate. The present invention is characterized in that: a plurality of ground pads arrayed equidistantly in a first row, and a plurality of signal pads arrayed equidistantly in a second row on the inside of and parallel to the first row, are provided on a first circumferential edge in the pad-array
(Continued)

region; each of the signal pads passes between two adjacent ground pads in the first row and is connected to an external circuit on the substrate; and electrical signals are input to and output from the external circuit.

6 Claims, 8 Drawing Sheets

(51) Int. Cl.
- *H01L 23/498* (2006.01)
- *G02B 6/122* (2006.01)
- *G02B 6/42* (2006.01)
- *H05K 1/18* (2006.01)
- *H05K 1/02* (2006.01)
- *H05K 3/46* (2006.01)

(52) U.S. Cl.
CPC ..... *H01L 23/49844* (2013.01); *H05K 1/0219* (2013.01); *H05K 1/0245* (2013.01); *H05K 1/181* (2013.01); *H01L 2224/16225* (2013.01); *H05K 1/0243* (2013.01); *H05K 1/0251* (2013.01); *H05K 3/4688* (2013.01); *H05K 2201/10121* (2013.01); *Y02P 70/611* (2015.11)

(56) References Cited

U.S. PATENT DOCUMENTS

| | | | |
|---|---|---|---|
| 7,057,115 B2* | 6/2006 | Clink | H05K 1/0245 174/255 |
| 7,322,855 B2* | 1/2008 | Mongold | H01R 13/6471 439/108 |
| 8,232,480 B2* | 7/2012 | Liu | H01L 23/49838 174/261 |
| 2005/0263881 A1 | 12/2005 | Danno et al. | |
| 2011/0093828 A1 | 4/2011 | Lee et al. | |

FOREIGN PATENT DOCUMENTS

| | | |
|---|---|---|
| JP | 2000-349192 A | 12/2000 |
| JP | 2004-525524 A | 8/2004 |
| JP | 2011-009776 A | 1/2011 |
| JP | 2011-171415 A | 9/2011 |
| JP | 2012-047823 A | 3/2012 |

OTHER PUBLICATIONS

International Search Report issued in Application No. PCT/JP2015/058012, dated Jun. 2, 2015.

\* cited by examiner

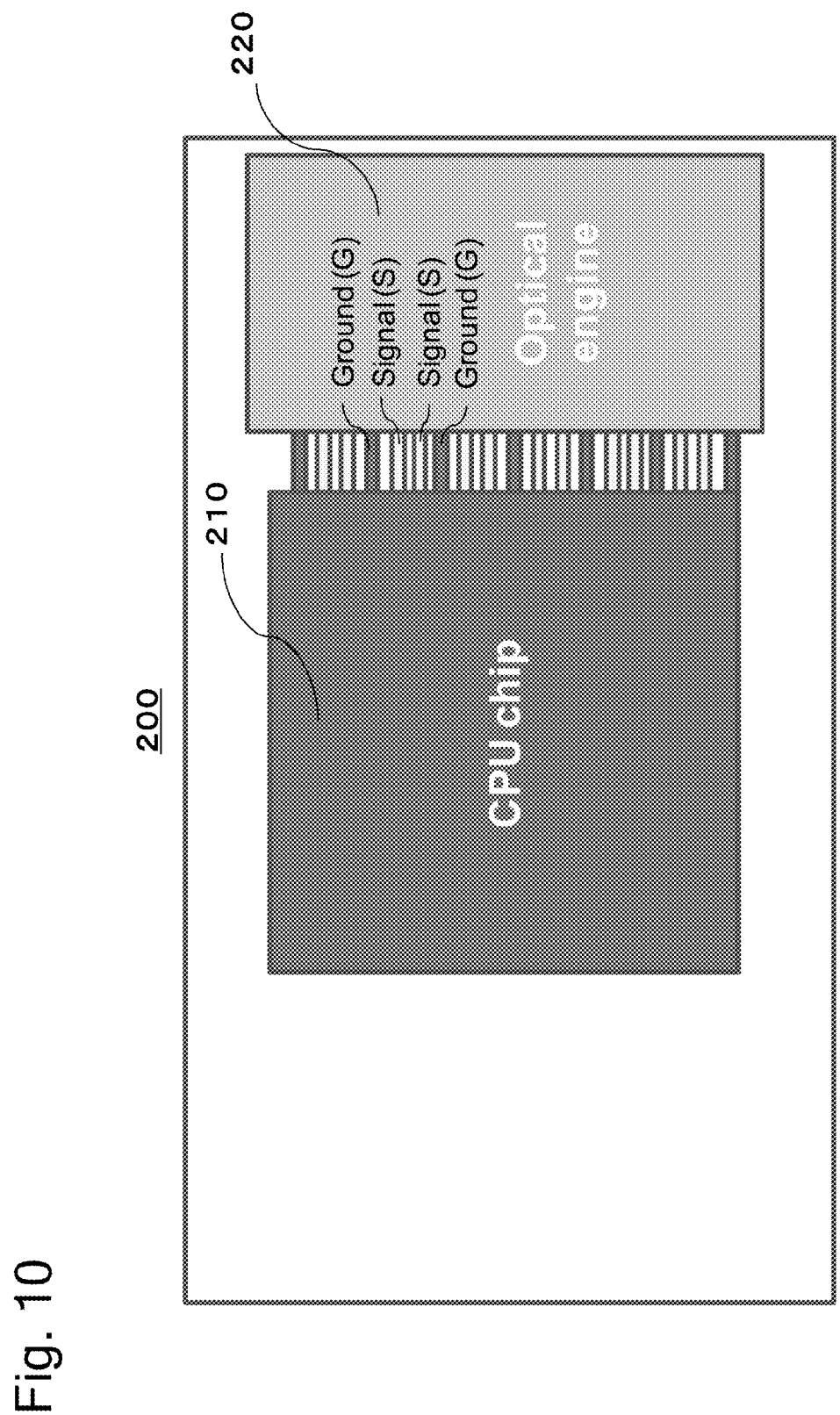

PAD-ARRAY STRUCTURE ON SUBSTRATE FOR MOUNTING IC CHIP ON SUBSTRATE, AND OPTICAL MODULE HAVING SAID PAD-ARRAY STRUCTURE

TECHNICAL FIELD

The present invention relates to a pad array structure on a substrate for installing an IC chip on the substrate; and, more specifically, the present invention relates to a pad array structure, specifically, a pad array structure for an IC chip on a substrate, that is characterized in relationships between ground pads and signal pads in terms of arrangement thereof in the pad array structure.

Also, the present invention relates to an optical module comprising a pad array structure, such as that described above, formed on a chip by means of a silicon-photonics technique.

BACKGROUND ART

In general, regarding a patterning structure implemented on a substrate for installing an IC chip, the degree of freedom thereof is low and the structure thereof is complicated. Especially, in an optical module that performs photoelectric conversion, the above tendency becomes apparent in the case that the number of optical elements on a substrate is large.

For example, as described in Patent-related Document 1, in the case of a prior-art optical module, optical elements such as a semiconductor laser, a photodiode, or the like that performs photoelectric conversion is included as a package within the optical module, and a part of the package comprises a ceramic substrate. The ceramic substrate comprises a multilayer structure; and conductor patterns and ground conductors, through which signals propagate, are patterned within the substrate or on the surface of the substrate in such a manner that the conductor patterns and the ground conductors do not cross each other.

A general factor that makes the patterning structure complicated is that a pattern for high-speed signals and a pattern for ground are placed in proximity to each other in an optical module. In an example of an optical module in Patent-related Document 1 (FIG. 1 of Patent-related Document 1), two lead pins for high-speed signals are arranged in proximity to each other, and lead pins for ground are arranged beside the pair of the two lead pins. Specifically, in FIG. 1 of Patent-related Document 1, a signal input/output part that is used for transmission of differential signals and has a GSSG (GND-SIGNAL-SIGNAL-GND) structure is shown, and it is to be connected to a conductor pad or a ground pad through vias within a multilayer substrate.

Also, there is another recent example of a prior-art optical module, wherein a silicon photonics technique is used for integrating and arranging a driver IC on a silicon-photonics chip, for the purposes of downsizing of a chip and reduction of electric power consumption (Non-patent-related Document 1). In the case of this example, since respective optical elements such as a semiconductor laser and so on are also installed on the silicon-photonics chip, increasing of the number of parts is inevitable. In other words, it is necessary to take into consideration, when designing a pad array region for connecting with the IC on a silicon-photonics chip, the matters such that (i) the degree of freedom is very low, and (ii) crossing of electric wires has to be avoided.

Generally, in a prior-art optical module such as that described in Non-patent-related Document 1, pads formed on a substrate and pads for connecting with the IC are connected by use of a multilayered wiring structure, for dealing with the matters described above. However, in the case that a multilayered wiring structure such as that described above is adopted, the structure becomes complicated and, further, wiring resistance becomes very large since it is necessary to built wiring between respective layers through vias.

CITATION LIST

Patent-Related Documents

Patent-related Document 1: JP Patent Application Public Disclosure No. 2012-047823

Non-Patent-Related Documents

Non-patent-related Document 1: "Demonstration of 12.5-Gbps optical interconnections integrated with lasers, optical splitters, optical modulators and photodetectors on a single silicon substrate," OPTICS EXPRESS, Vol. 20, No. 26 (1012/12/10), B256-B263

SUMMARY OF INVENTION

Technical Problem

An object of the present invention is to realize, in a pad array arrangement structure on a substrate for installing an IC chip on the substrate, a structure that avoids using multilayered wiring on a substrate by devising arrangement of pads on a pad array region for an IC. Further, another object of the present invention is to apply the pad array arrangement structure to an optical module, especially, to a dense, multichannel optical module to which a silicon photonics technique is applied.

Solution to Problem

For achieving the above objects, the present invention provides a pad array structure on a substrate for installing an IC chip on the substrate. Further, it is characterized in that a first peripheral part of a pad array region comprises: plural ground pads, wherein the ground pads are arranged in a first column, with equal distances between adjacent ground pads; and plural signal pads, wherein the signal pads are arranged in a second column that is positioned at an inward side of and in parallel with the first column, with equal distances between adjacent signal pads; wherein each of the signal pads extends through a place between two adjacent ground pads in the first column and connects to an external circuit on the substrate, so that an electric signal is inputted from the external circuit to the signal pad or outputted from the signal pad to the external circuit.

Further, the plural signal pads are set to constitute plural pairs of differential signal pads, and each of the ground pads in the first column in the first peripheral part is arranged in a place between adjacent two pairs of the differential signal pads in the second column in the first peripheral part. Further, at least one of the ground pads in the first column in the first peripheral part is arranged in a place corresponding to a center between adjacent two pairs of the differential signal pads in the second column in the first peripheral part.

An embodiment of the present invention provides an optical module comprising the pad array structure. Further, it is characterized in that the IC chip is installed on an opto-electric hybrid board, and that the IC chip is one of a driver IC for driving an optical device, a receiver (receiving device) IC for receiving an optical signal, and a transmitter (transmitting device) IC for transmitting an optical signal.

BRIEF DESCRIPTION OF DRAWINGS

FIG. 10 is a schematic top view representing the case that a pad array arrangement according to an embodiment of the present invention is applied to a silicon interposer.

DESCRIPTION OF EMBODIMENTS

In the following description, a pad array arrangement structure formed on a substrate, according to an embodiment of the present invention, will be explained with reference to the figures. Note that, regarding the following pad array arrangement structure, a pad array arrangement structure for a driver IC chip on an opto-electric hybrid board that is included in an optical module, to which a silicon photonics technique is applied, is mainly explained. However, the pad array arrangement structure on a substrate, according to an embodiment of the present invention, is not limited to the above, and the pad array arrangement structure is similarly applicable to a receiver (a receiving device) for receiving an optical signal and a transceiver (a transmitting device) for transmitting an optical signal on an opto-electric hybrid board in an optical module. Further, in addition to the above matters, it should be noted that the pad array arrangement structure according to the present invention is also applicable to a silicon interposer having a similar pad array structure, for example. Also, note that similar reference symbols are assigned to similar components in the figures.

Figure 1:
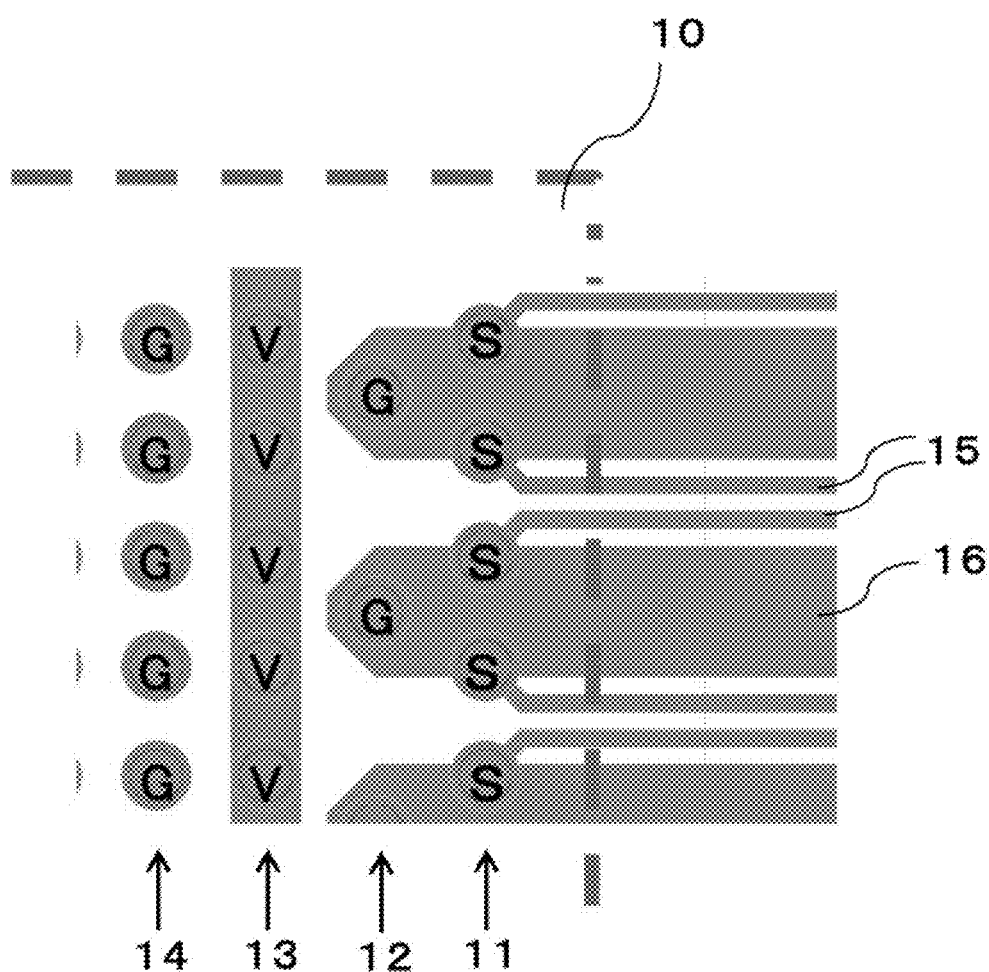
FIG. 1 shows an example of a pad array arrangement structure on a substrate, according to a prior-art technique.

FIG. 1 is a top view showing an example of arrangement of a pad array on an opto-electric hybrid board of an optical module and wiring relating thereto, according to the above explained prior-art technique. In the figure, the inside of a dashed line region is a pad array region 10, and part of arrangement of various types of pads is enlarged and shown. In the case that the prior-art pad array arrangement is adopted, it is necessary to use a multilayered wiring structure for wiring.

Various types of pads will be explained. From a side of a peripheral part of the IC pad array region 10 (the right side within the dashed line region in this case), an "S" column 11, a "G" column 12, a "V" column 13, and a "G" column 14 are arranged in parallel with each other in this order. The "S" column 11 comprises plural signal pads (S), that are arranged with equal distances therebetween, for making high frequency signals propagate through high-speed signal wires 15. Plural signal pads (S) are configured to constitute pairs of differential signal pads. The signal wire 15 is connected to an external circuit via a high-speed signal pad (not shown) formed on a substrate, so that a differential electric signal is inputted from the external circuit to the signal pad or outputted from the signal pad to the external circuit.

Further, the "G" column 12 is arranged to be positioned at an inward side of and in parallel with the "S" column 11, and comprises plural ground pads (G) that are arranged with equal distances therebetween. Each ground pad (G) is connected to a ground wire 16, and connected to a ground pad (not shown) formed on the substrate. A person skilled in the art should understood that the ground wire 16 is generally required to be positioned in proximity to the signal wire 15 for maintaining a characteristic impedance during propagation of a high frequency signal. Thus, as shown in FIG. 1, it is preferable to establish a relationship between the "S" column 11 and the "G" column 12 such that they are adjacent to each other.

Further, the "V" column 13 and the "G" column 14, that are arrange in parallel with each other, comprise plural electric-power-source voltage pads and plural ground pads, respectively. Note that the "G" column 14 in this example is connected to the "G" column 12 (connection is not shown).

As would be understood from FIG. 1, in general, the line width of the ground wire 16 is made to be substantially wider than that of the signal wire 15, and the area of the ground wire 16 is thus made to be several-tens-of-times larger than that of the signal wire 15. Further, in the pad array region 10, since the "G" column 12 is arranged at an inward side of the "S" column 11, the ground wire 16 overlaps a part of the signal pad arrangement section and a part of the signal wire 15, so that the wiring rule cannot be satisfied. Especially, in the case that the construction according to the example shown in FIG. 1 is applied to a dense, multichannel device such as a driver IC on a silicon substrate, the spaces between signal pads are forced to be very narrow, so that it is difficult to form, by use of a single-layer structure, a ground wire in such a manner that it extends through a space between signal pads.

In such a case, as explained with reference the above prior-art technique, it is required to implement a countermeasure such as that for preventing crossing of wires by adopting a multilayered wiring structure. For a reason similar to that described above, a multilayered wiring structure is required in the case that ground pads in the "G" column 12 are connected to those in the "G" column 14. However, as explained above, in the case that a multilayer structure is adopted on a substrate, wiring resistance becomes very large, since a structure for using vias for connection between wires of respective layers would be constructed; and such increase of wiring resistance is not desirable.

Figure 2:
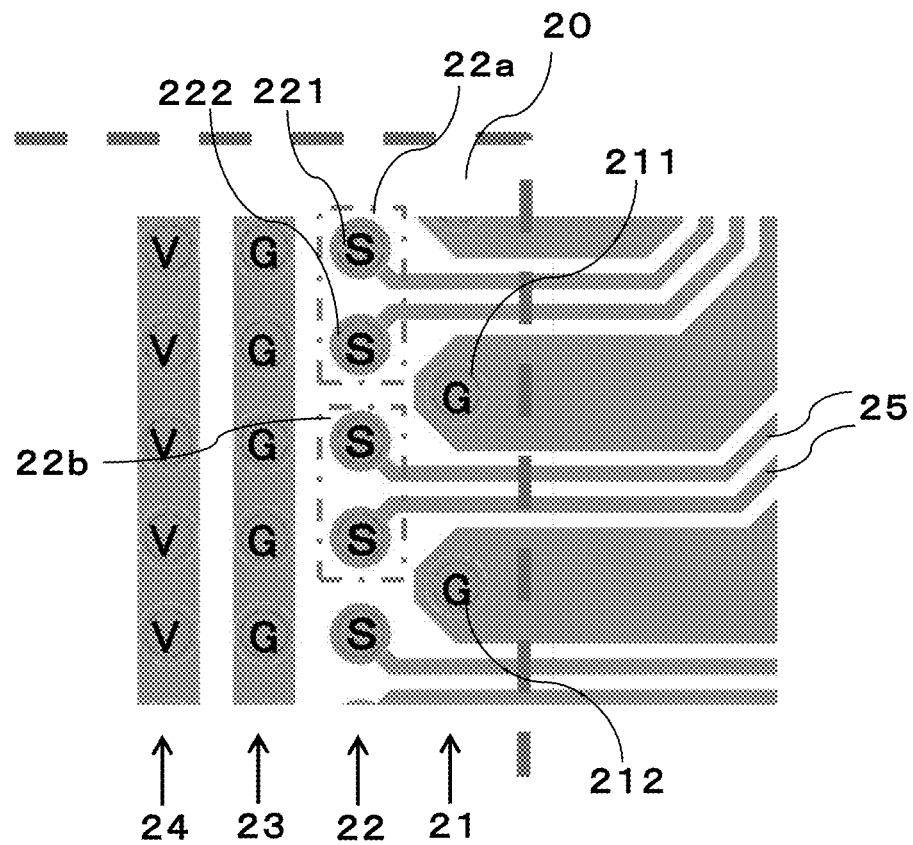
FIG. 2 shows an example of a pad array arrangement structure on a substrate, according to an embodiment of the present invention.

FIG. 2 is a top view showing an example of a pad array arrangement structure on a substrate and wiring relating thereto, according to an embodiment of the present invention, wherein the structure is devised for avoiding adoption of multilayered wiring such as that shown in FIG. 1. The inside of a dashed line region is a pad array region 20, and part of arrangement of various types of pads are enlarged and shown in a manner similar to that of FIG. 1.

Regarding various types of pads, from a side of a peripheral part of the pad array region 20 (the right side within the dashed line region in this case), a "G" column 21, an "S" column 22, a "G" column 23, and a "V" column 24 are arranged in this order. In the "G" column 21, plural ground pads are arranged with equal distances therebetween; and, in the "S" column 22 that is adjacent to and in parallel with the "G" column 21, plural signal pads are arranged with equal distances therebetween. Compared with the example shown in FIG. 1, it should be reminded that the positional relationship between the "G" column 21 (12) and the "S" column 22 (11) is opposite.

In FIG. 2, in the IC pad array region 20, the "S" column 22 is positioned at an inward side of the "G" column 21. Further, a signal wire 25 extending from each signal pad in the "S" column 22 extends through a space between two adjacent ground pads 211 and 212 in the "G" column 21, and connects to an external circuit on the substrate via a high-speed signal pad (not shown) formed on the substrate, for inputting an electric signal from the external circuit to the signal pad or outputting an electric signal from the signal pad to the external circuit.

Further, as explained in relation to FIG. 1, adjacent two differential signal pads in the plural signal pads 221-22N in the "S" column 22 are paired to construct plural signal pad pairs 22a-22n. Each ground pad in the "G" column 21 is positioned in a place corresponding to a place (especially, a middle place) between two adjacent differential signal pad pairs in the "S" column 22. For example, the ground pad 211 is positioned in a place corresponding to a middle point between the differential signal pad pairs 22a and 22b, as shown in the figure.

By making the pad array structure to have the above construction, overlapping between signal wires and ground wires, such as that observed in FIG. 1, does not appear in relation to arrangement of respective pads in the "G" column 21 and the "S" column 22 and wiring relating thereto; thus, use of the multilayered wiring structure can be avoided, i.e., the pad array structure can be realized by use of a single-layer wiring. As a result thereof, the wiring resistance of the IC electric-power-source wiring can be notably reduced.

Figure 3:
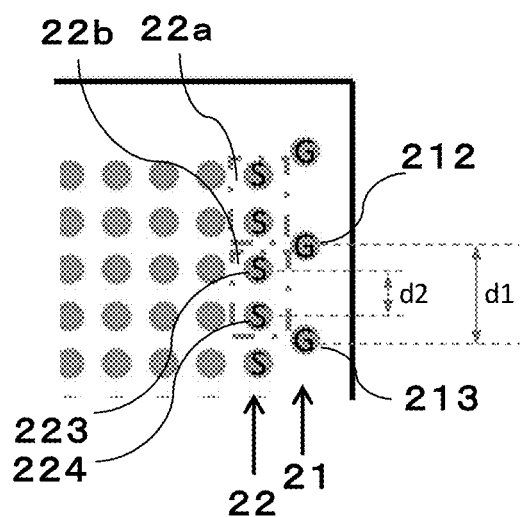
FIG. 3 shows an example of a pad array arrangement structure according to an embodiment of the present invention.

FIG. 3 shows, by scaling the drawing of the IC pad array region 20 in FIG. 2, the pad array (a part thereof) of the IC pad array region 20. As explained above, the ground pad 212 is positioned in a place corresponding to a middle place between two adjacent differential signal pad pairs 22a and 22b in the "S" column 22. In this case, it is understood that the pitch d1 between two ground pads 212 and 213 is exactly twice the pitch between the two differential pads 223 and 224.

Figure 4:
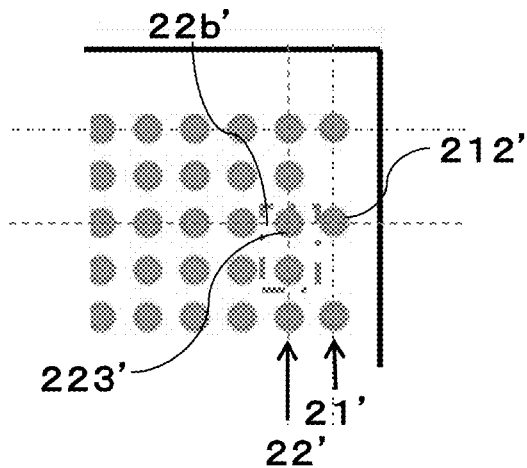
FIG. 4 shows an alternative example of a pad array arrangement structure according to an embodiment of the present invention.

Although each ground pad in the "G" column 21 is positioned in a place corresponding to a middle place between two adjacent differential signal pad pairs in the "S" column 22 in each of FIGS. 2 and 3, the position is not limited to that explained above. For example, like an alternative example in FIG. 4, a ground pad 212' in a "G" column 21' may be positioned in a place corresponding to a place of one of signal pads in a differential signal pad pair 22b' (223' in this example); that is, the pads may be arranged in a grid form.

That is, any form of arrangement may be possible, as long as each pad is arranged in such a manner that each signal wire extending from each signal pad in the "S" column extends through a place between two adjacent ground pads in the "G" column, and that each wire is arranged accordingly.

Figure 5:
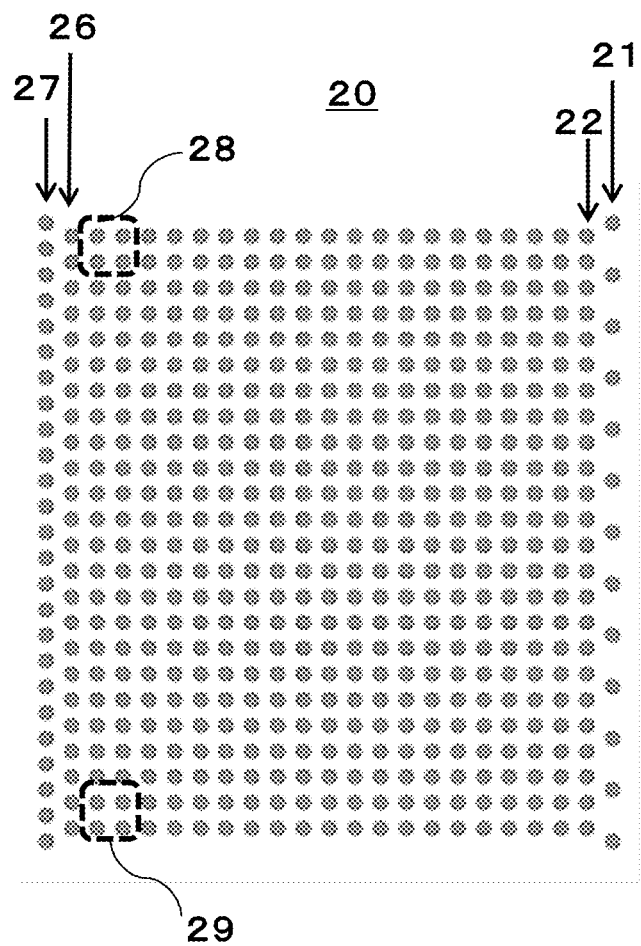
FIG. 5 shows an example of the whole pad array arrangement structure according to an embodiment of the present invention.

FIG. 5 is a top view showing the whole IC pad array region 20 shown in each of FIGS. 2 and 3, according to an embodiment of the present invention. As explained above, the above "G" column 21, "S" column 22, . . . , correspond to those from a side (the right side in this example) of the peripheral part of the IC pad array region 20. In the pad array arrangement according to an embodiment of the present invention, plural IC control pads may be further arranged at a left-side peripheral part that is located opposite to the right-side peripheral part, especially, at regions 28 and 29 positioned at places located near the inward side of both ends of the left-side peripheral part. The wiring structure for connecting the IC control pads in the IC pad array region 20 and corresponding IC control pads (not shown) in the substrate is constructed based on consideration such that it is preferable to have a distance between the wiring structure and the single-layer wiring structure of the part of the "S" column 22 and the "G" column 21 in each of FIGS. 2 and 3 as much as possible, in view of design such that it is general to adopt a multilayered wiring structure as the wiring structure for connection between the IC control pads in the IC pad array region 20 and corresponding IC control pads (not shown) in the substrate. By arranging the multi-layered wiring structure for the IC control pads at a specific corner part of the IC pad array region 20 in this manner, the wiring structure can be simplified.

Further, for example, in the case that the IC chip is a chip for an optical transmitter, the distances between the IC control pads and the IC electric-power-source pads can be reduced by arranging, in the IC pad array region, the arranged columns 26 and 27 of the IC electric-power-source pads in such a manner that the two columns are adjacently positioned in parallel with each other, at the outward side of the IC control pad arrangement region in the left-side peripheral part; and, as a result thereof, the structure can be further simplified.

In the above case, a single-layer structure should be used also, by considering avoidance of adoption of a multilayered wiring structure in the part of the IC electric-power-source pads. In other words, as shown in FIG. 5, in the IC electric-power-source pad columns 26 and 27 in the IC pad array region, it is preferable to arrange each IC electric-power-source pad in the IC electric-power-source pad column 27 in such a manner that it is positioned in a place corresponding to the middle point of two adjacent IC electric-power-source pads in the IC electric-power-source pad column 26. That is, it is preferable to arrange the two columns, i.e., the IC electric-power-source pad columns 26 and 27, in a staggered manner.

FIG. 2 will be referred to again. In the IC pad array region 20 according to an embodiment of the present invention, the "G" column and the "V" column are arranged in this order at the inward side of the "G" column 21 and the "S" column 22. When FIG. 1 and FIG. 2 are compared, it should be noted that the positional relationship between the "G" column 23 and the "V" column 24 is opposite to the other. The reason to arrange the "G" column 23 at a place inside and proximity to the "S" column 22 in a manner of the above embodiment is to take necessity to connect the respective ground pads in the "G" column 23 to the respective ground pads in the "G" column 21 into consideration; and, in this regard, by adopting arrangement such as that shown in FIG. 2, the distance between the "G" column 23 and the "G" column 21 can be reduced.

Figure 6:
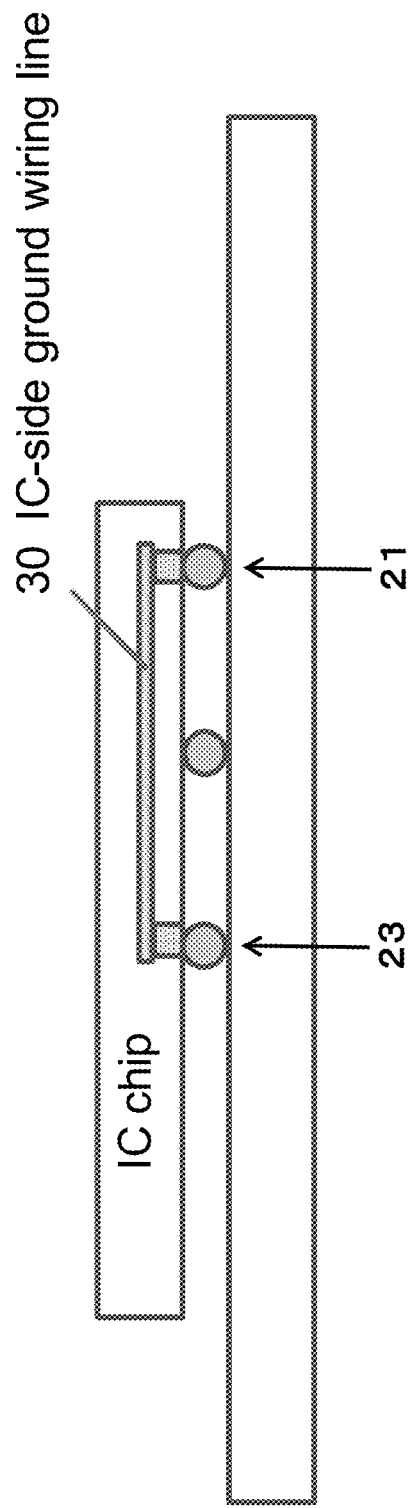
FIG. 6 is a schematic cross-section view showing connection between ground pads via an IC-side ground wire, in a pad array arrangement according to an embodiment of the present invention.
Figure 7:
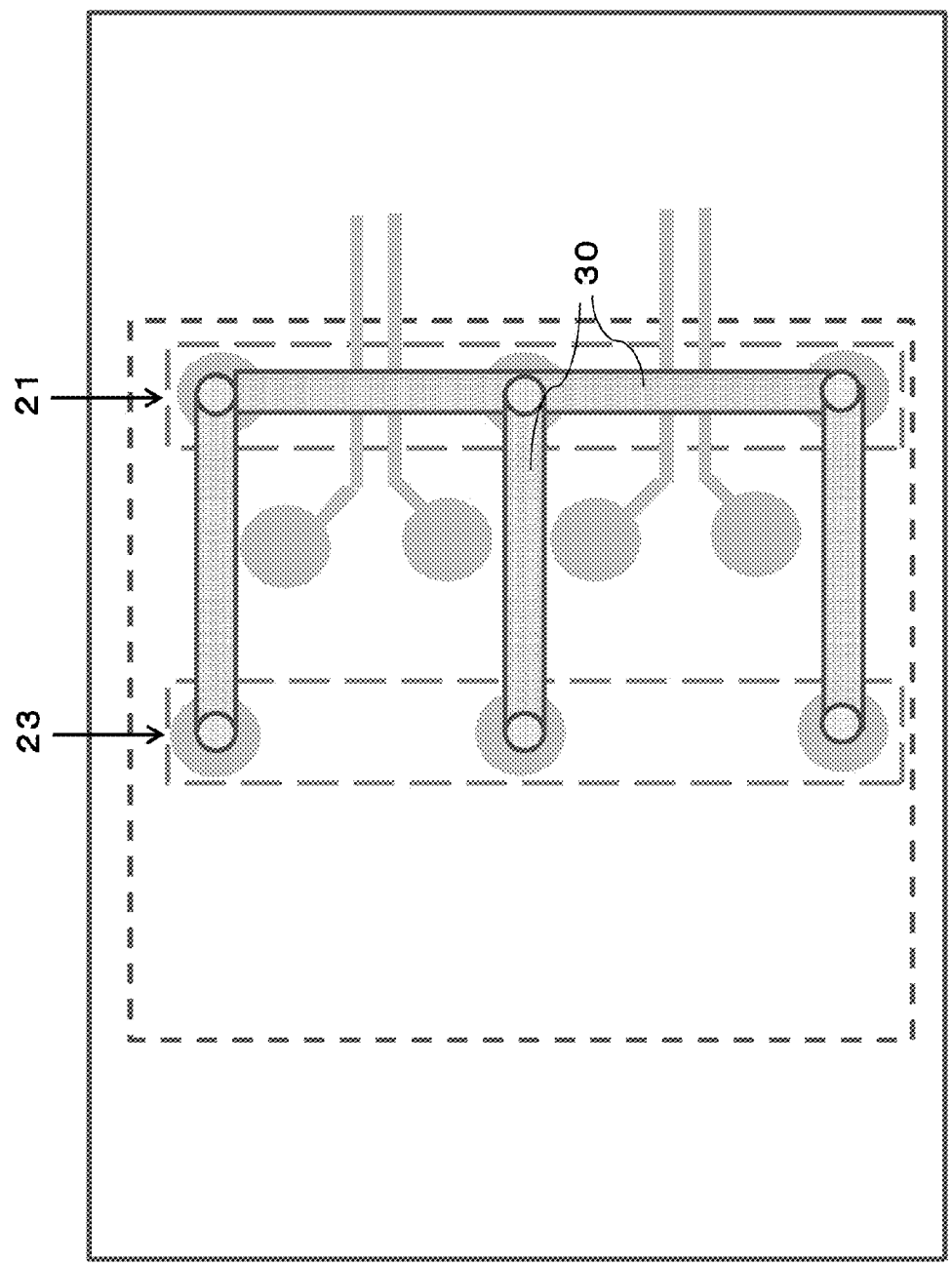
FIG. 7 is a schematic top view showing connection between ground pads via IC-side ground wires, in a pad array arrangement according to an embodiment of the present invention.

Incidentally, when connecting the ground pads, adoption of a multilayered wiring structure should be avoided also. That is, in an embodiment of the present invention, and in the case that adoption of a multilayered wiring structure is to be avoided, the respective ground pads in the "G" column 23 are connected to the respective ground pads in the "G" column 21 via an IC chip installed on the top part of the substrate as shown in FIGS. 6 and 7. FIG. 6 shows a schematic cross-section view of a substrate and an IC chip installed on the substrate, and FIG. 7 shows an example of a schematic top view corresponding to FIG. 6. By adopting a construction such that ground wires 30 are provided at an IC-chip side and connection between the ground pads (specifically, connection between the ground pads in the "G" column 21 and the ground pads in the "G" column 23, and connection between adjacent ground pads in the "G" column 21) are made by the IC-chip-side ground wires 30 in the above manner, adoption of a multilayered wiring structure in the substrate can be avoided. Note that the embodiment of arrangement of the respective pads shown above is a mere example.

Figure 8:
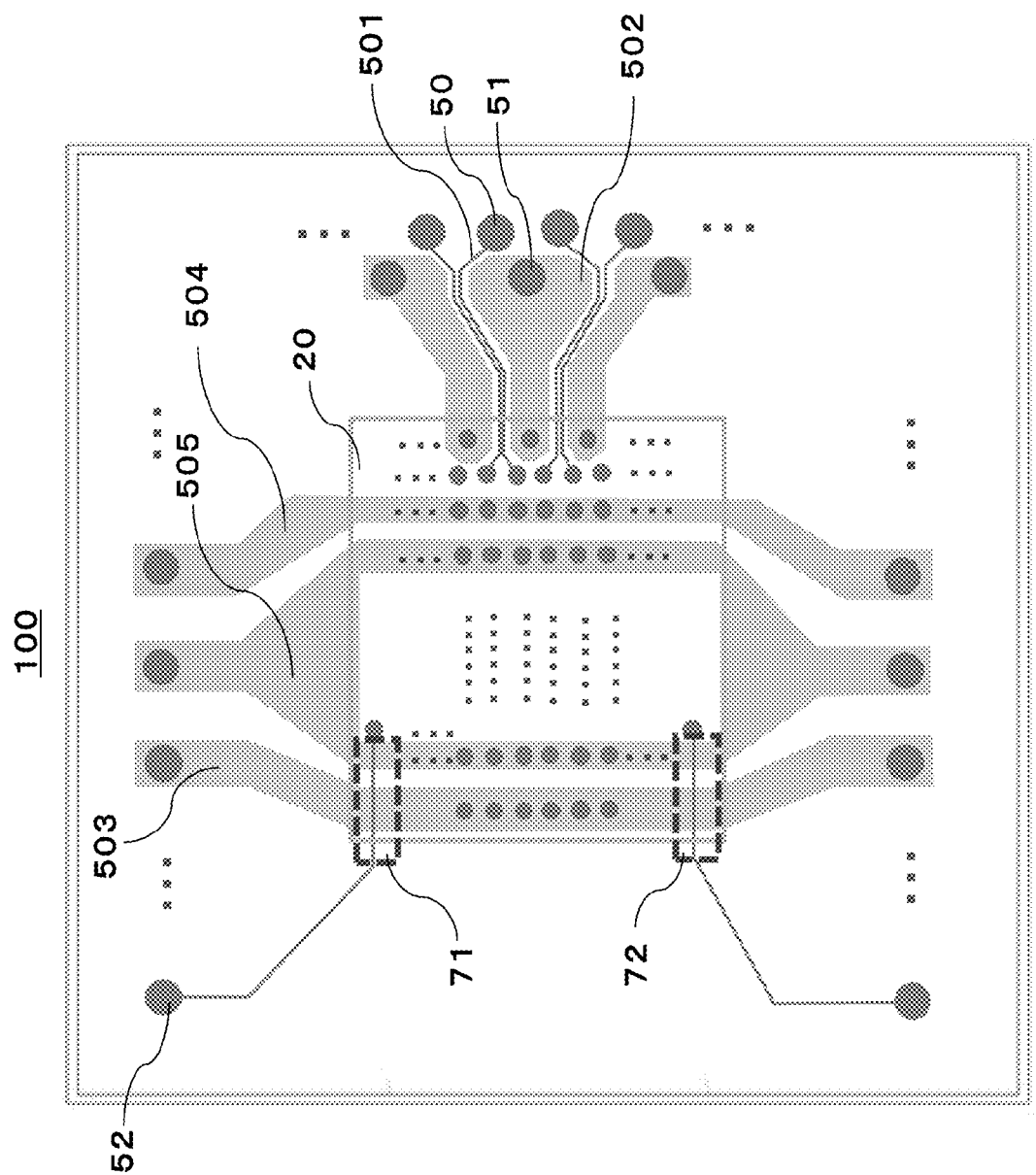
FIG. 8 is an example of a drawing of an element arrangement region, in the case that a pad array arrangement according to an embodiment of the present invention is applied to an optical module.

FIG. 8 is an example of a drawing of an element arrangement region on an opto-electric hybrid board 100 in an optical module, in the case that an IC pad array structure according to the present invention constructed in the above manner is applied to the optical module. The IC chip in the optical module is installed on the opto-electric hybrid board, and is one of a driver IC for driving an optical device, a receiver (receiving device) IC for receiving an optical signal, and a transceiver (transmitting device) IC for transmitting an optical signal. Also, the drawing of the element arrangement region on an opto-electric hybrid board 100 shown in FIG. 8 can be used as a drawing of an element arrangement region on an opto-electric hybrid board that is constructed as an optical transmitter or a transmitting part of a transceiver.

The IC pad array region 20, that is explained by use of FIGS. 2-5, is arranged in the opto-electric hybrid board 100. Further, along the peripheral part of the opto-electric hybrid board 100, various types of pads for connection to an external circuit, i.e., plural differential signal pads 50, plural ground pads 51, plural IC control pads 52, and so on are arranged. In the places between the IC pad array region 20 and the various types of pads arranged in the peripheral part of the opto-electric hybrid board 100, wires (signal wires 501, ground wires 502-504, and electric-power-source wire 505) are arranged, mainly.

By adopting the IC pad array region 20 according to the present invention in the above manner and thereby forming the pad array region of the opto-electric hybrid board, the wiring structure can be simplified and the multilayered wiring structure can be minimized. For example, in the drawing of the element arrangement region shown in FIG. 8, only the dashed line regions 71 and 72 comprise multilayered wiring structures, and other regions can be realized as those comprising single-layer structures. The reason that the dashed line regions 71 and 72 comprise multilayered wiring structures is that the IC control wires extending from the pad array region 20 to the IC control pads 52 cross the electric-power-source (reinforced) wire 505 and the ground (reinforced) wire 503, as shown in the figure. In proportion to reduction of multilayered wiring structures, the number of vias to be used for connection between layers can be reduced and, thus, the wiring resistance of the IC electric-power-source wires due to the vias can be reduced.

Figure 9:
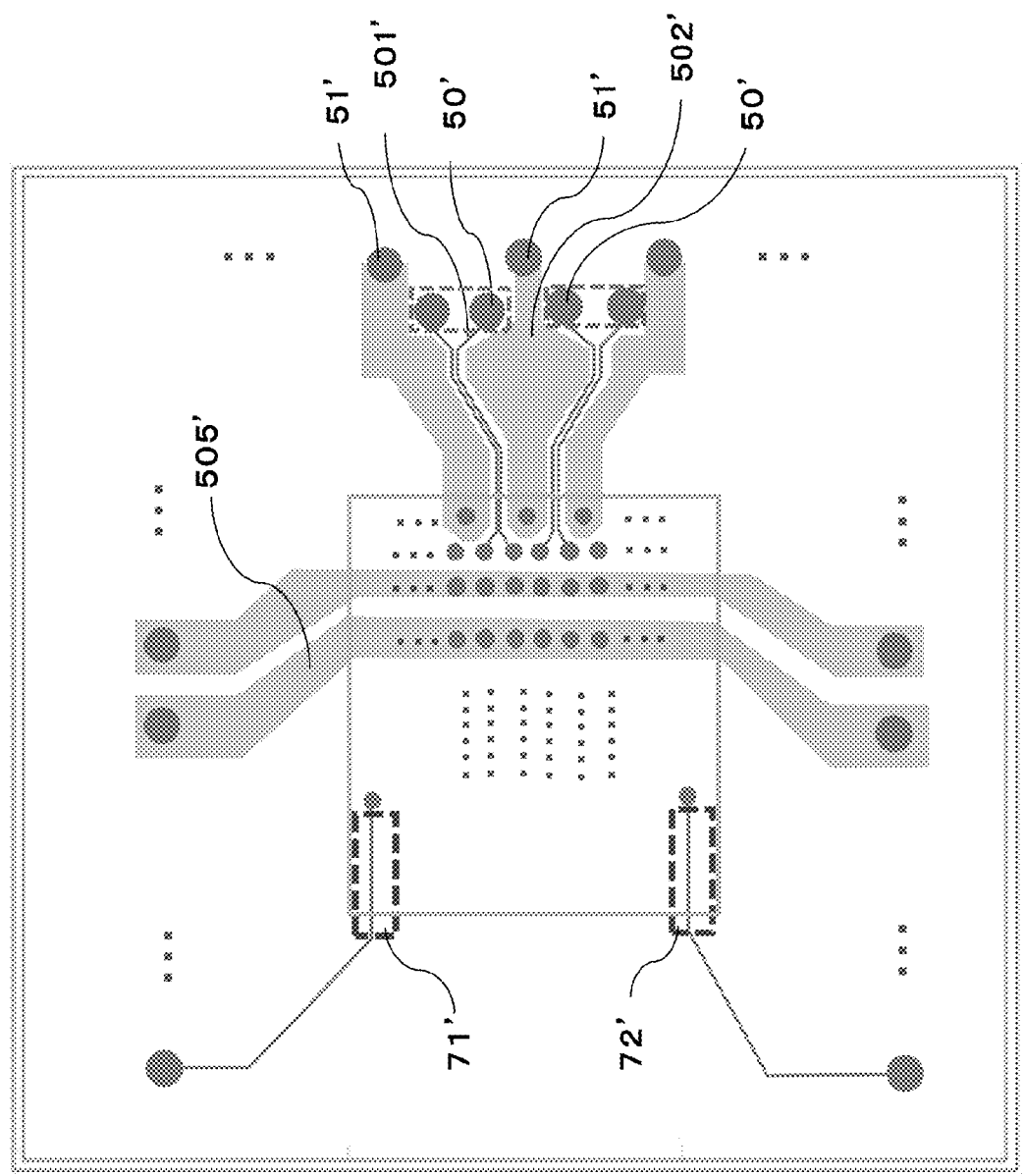
FIG. 9 is another example of a drawing of an element arrangement region, in the case that a pad array arrangement according to an embodiment of the present invention is applied to an optical module.

In relation to minimization of the multilayered wiring structures, FIG. 9 shows a different modification of a drawing of an element arrangement region on an opto-electric hybrid board 100 in an optical module, in the case that an IC pad array structure according to the present invention is applied to the optical module. In the example shown in FIG. 9, when compared with the example shown in FIG. 8, the ground (reinforced) wire 503 is removed, and arrangement of the electric-power-source (reinforced) wire 505' is limited in a certain way. It is understandable, in the drawing of the element arrangement region shown in FIG. 9, that the whole wiring structure including the dashed line regions 71' and 72' can be realized as a single layer structure, by adopting such an arrangement construction described above.

Further, in FIG. 9, in addition to wiring structuralization of the above dashed line regions 71' and 72', the part of the ground wire 502' is also modified. By the modification, the IC pad array structure according to the present invention can be applicable, when an opto-electric hybrid board (a silicon substrate) is connected to a printed circuit board, as an electrode pattern used for connection between these elements.

More specifically, in the inside of the silicon substrate, the arranged column of ground pads 51' is positioned at an outward side of the arranged column of differential signal pads 50', and each ground pad 51' is arranged in a position corresponding the middle position between two adjacent differential signal pads 50'. By adopting the above construction, dense wiring design can be allowed even in the case that connection from a silicon substrate to a printed circuit board, in which a pad size is larger, is to be made.

The IC pad array structure explained in the above description is also applicable to various devices, in addition to an optical module.

For example, in each of FIGS. 8 and 9, the IC pad array structure according to the present invention is applied to an optical module; and, on the other hand, FIG. 10 shows a top view representing the case that the IC pad array structure is applied to a silicon interposer. In FIG. 10, it is constructed such that the IC pad array structure is formed on a silicon interposer 200, and a CPU chip 210 is installed thereon. By having the construction explained above, connection to an optical engine can be realized by a GSSG (GND-SIGNAL-SIGNAL-GND) structure formed by using single-layer wiring.

In the above description, the embodiments of the present invention has explained with reference to the drawings; and, in this regard, a person skilled in the art would understand that other similar embodiments can be used, and that modification of an embodiment and/or addition of a component can be made without departing from the present invention. Note that the present invention should not be limited to the above embodiments; and the present invention should be construed based on the descriptions in the claims.

REFERENCE SIGNS LIST

10, 20 Pad array region
100 Optical-electric hybrid substrate
11, 22, 22' "S" column
22*a*, 22*b*, 22*b*' Pair of differential signal pads
221-224, 223' Signal pad
12, 14, 21, 21', 24 "G" column
211-213, 212' Ground pad 13, 23 "V" column
15, 25 Signal wire
16 Ground wire
26, 27 Column of arranged IC electric power source pads
28, 29 Region of arranged IC electric power source pads
30 IC ground wire
50, 50' Differential signal pad
51, 51' Ground pad
501, 501' Signal wire
502-504, 502' Ground wire
505, 505' Electric power source wire
52 IC control pad
200 Silicon interposer
210 CPU chip
220 Optical engine

The invention claimed is:

1. A pad array structure on a substrate for installing an IC chip on the substrate, the pad array structure comprising, in a first peripheral part of a pad array region:
plural ground pads, wherein the ground pads are arranged in a first column, with equal distances between adjacent ground pads; and
plural signal pads, wherein the signal pads are arranged in a second column that is positioned at an inward side of and in parallel with the first column, with equal distances between adjacent signal pads;
wherein each of the signal pads extends through a place between two adjacent ground pads in the first column and connects to an external circuit on the substrate, so that an electric signal is inputted from the external circuit to the signal pad or outputted from the signal pad to the external circuit,
wherein the plural signal pads are set to constitute plural pairs of differential signal pads, and
wherein each of the ground pads in the first column in the first peripheral part is arranged in a place between adjacent two pairs of the differential signal pads in the second column in the first peripheral part.

2. The pad array structure according to claim 1, wherein at least one of the ground pads in the first column in the first peripheral part is arranged in a place corresponding to a middle point between adjacent two pairs of the differential signal pads in the second column in the first peripheral part.

3. The pad array structure according to claim 1, wherein plural IC pads are arranged in places located near an inward side of both ends of a second peripheral part that is located at a side opposite to that of the first peripheral part.

4. An optical module comprising the pad array structure according to claim 1, wherein the IC chip is installed on an opto-electric hybrid board, and the IC chip is one of a driver IC for driving an optical device, a receiver IC for receiving an optical signal, and a transceiver IC for transmitting an optical signal.

5. The optical module according to claim 4, further comprising second plural ground pads arranged at an inward side of the second column in the first peripheral part of the pad array region, and each of the second plural ground pads is connected via the IC chip to a ground pad in the first column in the first peripheral part.

6. A silicon interposer comprising the pad array structure according to claim 1.

* * * * *